United States Patent
Farnworth et al.

(10) Patent No.: US 6,980,017 B1
(45) Date of Patent: Dec. 27, 2005

(54) TEST INTERCONNECT FOR BUMPED SEMICONDUCTOR COMPONENTS AND METHOD OF FABRICATION

(75) Inventors: Warren M. Farnworth, Nampa, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/266,237

(22) Filed: Mar. 10, 1999

(51) Int. Cl.[7] .................. G01R 31/02; G01R 31/26
(52) U.S. Cl. ............................... 324/765; 324/755
(58) Field of Search ...................... 324/754, 755, 324/757, 758, 761, 762, 765; 174/251, 255, 256, 261; 361/748, 760, 767, 769, 771, 772, 774, 776

(56) References Cited

U.S. PATENT DOCUMENTS

| | | | |
|---|---|---|---|
| 4,686,468 A | * 8/1987 | Lee et al. ............... 324/757 |
| 4,766,666 A | 8/1988 | Sugiyama et al. |
| 4,937,653 A | 6/1990 | Blonder et al. ............ 357/68 |
| 5,006,792 A | 4/1991 | Malhi et al. ........... 324/158 F |
| 5,042,148 A | 8/1991 | Tada et al. .............. 29/852 |
| 5,073,117 A | 12/1991 | Malhi et al. ............. 439/71 |
| 5,103,557 A | * 4/1992 | Leedy ................... 438/6 |
| 5,131,852 A | 7/1992 | Grabbe et al. |
| 5,137,461 A | 8/1992 | Bindra et al. ............. 439/74 |
| 5,172,050 A | 12/1992 | Swapp ................ 324/158 P |
| 5,196,726 A | 3/1993 | Nishiguchi ............... 257/737 |
| 5,329,423 A | 7/1994 | Scholz ................. 361/760 |
| 5,481,205 A | 1/1996 | Frye et al. ............... 324/757 |
| 5,483,741 A | 1/1996 | Akram et al. ............. 29/846 |
| 5,500,605 A | 3/1996 | Chang ................. 324/758 |
| 5,541,525 A | 7/1996 | Wood et al. ............. 324/755 |
| 5,559,444 A | 9/1996 | Farnworth et al. ......... 324/754 |
| 5,572,140 A | * 11/1996 | Lim et al. ............... 324/755 |
| 5,592,736 A | 1/1997 | Akram et al. ............. 29/842 |
| 5,607,818 A | 3/1997 | Akram et al. ............ 430/311 |
| 5,625,298 A | 4/1997 | Hirano et al. ............ 324/754 |
| 5,629,837 A | 5/1997 | Barabi et al. ............. 361/767 |
| 5,632,631 A | 5/1997 | Fjelstad et al. |
| 5,686,317 A | 11/1997 | Akram et al. ............. 437/8 |
| 5,691,649 A | 11/1997 | Farnworth et al. ......... 324/755 |
| 5,783,461 A | 7/1998 | Hembree ................ 438/17 |
| 5,801,452 A | 9/1998 | Farnworth et al. ......... 257/797 |
| 5,802,699 A | 9/1998 | Fjelstad et al. |

(Continued)

FOREIGN PATENT DOCUMENTS

EP 08050146 2/1996

OTHER PUBLICATIONS

"Technical Report, Shin–Etsu Inter Connector, MT–Type," Shin–Etsu Polymer America, Inc., No. MT–Type US, pp. 1–4, and title page, Aug. 5, 1998.*

Information Displayed at Chip Con 1997–1998, 4 sheets, on FE CRD Floating Point Technology, (month unavailable).

Primary Examiner—David A. Zarncke
Assistant Examiner—Russell M. Kobert
(74) Attorney, Agent, or Firm—Stephen A. Gratton

(57) ABSTRACT

An interconnect for testing semiconductor components includes a substrate, and contacts on the substrate for making temporary electrical connections with bumped contacts on the components. Each contact includes a recess and a pattern of leads cantilevered over the recess configured to electrically engage a bumped contact. The leads are adapted to move in a z-direction within the recess to accommodate variations in the height and planarity of the bumped contacts. In addition, the leads can include projections for penetrating the bumped contacts, a non-bonding outer layer for preventing bonding to the bumped contacts, and a curved shape which matches a topography of the bumped contacts. The leads can be formed by forming a patterned metal layer on the substrate, by attaching a polymer substrate with the leads thereon to the substrate, or be etching the substrate to form conductive beams.

16 Claims, 10 Drawing Sheets

U.S. PATENT DOCUMENTS

| | | | |
|---|---|---|---|
| 5,810,609 A | 9/1998 | Faraci et al. | |
| 5,834,945 A | 11/1998 | Akram et al. | 324/755 |
| 5,900,674 A | 5/1999 | Wojnarowski et al. | |
| 5,931,685 A | 8/1999 | Hembree et al. | |
| 5,936,847 A | 8/1999 | Kazle | |
| 5,962,921 A | 10/1999 | Farnworth et al. | |
| 5,973,394 A | 10/1999 | Slocum et al. | |
| 6,005,288 A | 12/1999 | Farnworth et al. | |
| 6,016,060 A | 1/2000 | Akram et al. | |
| 6,037,667 A * | 3/2000 | Hembree et al. | 257/779 |
| 6,040,702 A | 3/2000 | Hembree et al. | |
| 6,072,326 A | 6/2000 | Akram et al. | |
| 6,086,386 A * | 7/2000 | Fjelstad et al. | 439/70 |
| 6,091,252 A | 7/2000 | Akram et al. | |
| 6,094,988 A * | 8/2000 | Aindow | 73/649 |
| 6,107,109 A | 8/2000 | Akram et al. | |
| 6,114,864 A * | 9/2000 | Soejima et al. | 324/754 |
| 6,188,301 B1 | 2/2001 | Kornrumpf et al. | |
| 6,200,143 B1 | 3/2001 | Haba et al. | |
| 6,208,156 B1 | 3/2001 | Hembree | |
| 6,208,157 B1 | 3/2001 | Akram et al. | |
| 6,222,280 B1 | 4/2001 | Farnworth et al. | |
| 6,232,243 B1 | 5/2001 | Farnworth et al. | |
| 6,242,932 B1 | 6/2001 | Hembree | |
| 6,242,935 B1 | 6/2001 | Akram | |
| 6,294,837 B1 | 9/2001 | Akram et al. | |
| 6,310,484 B1 | 10/2001 | Akram et al. | |
| 6,313,651 B1 | 11/2001 | Hembree et al. | |
| 6,314,641 B1 | 11/2001 | Akram | |
| 6,337,577 B1 | 1/2002 | Doherty et al. | |
| 6,406,774 B1 | 6/2002 | Banba et al. | |
| 6,414,506 B2 | 7/2002 | Akram et al. | |
| 6,437,591 B1 * | 8/2002 | Farnworth et al. | 324/765 |
| 6,498,503 B2 | 12/2002 | Akram et al. | |
| 6,529,026 B1 | 3/2003 | Farnworth et al. | |

* cited by examiner

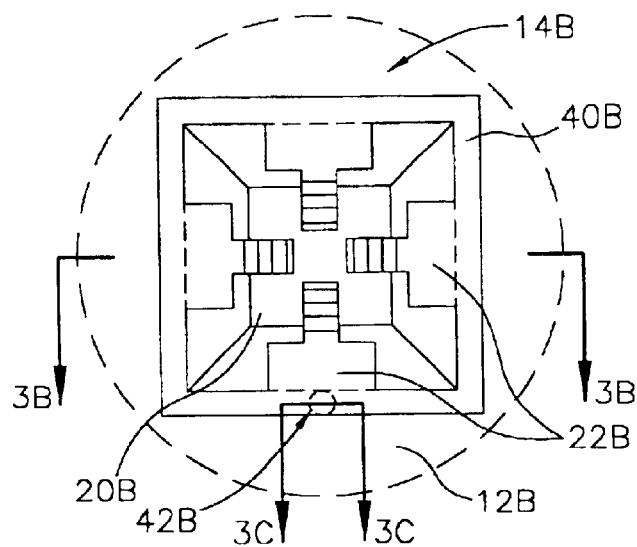
FIGURE 3A
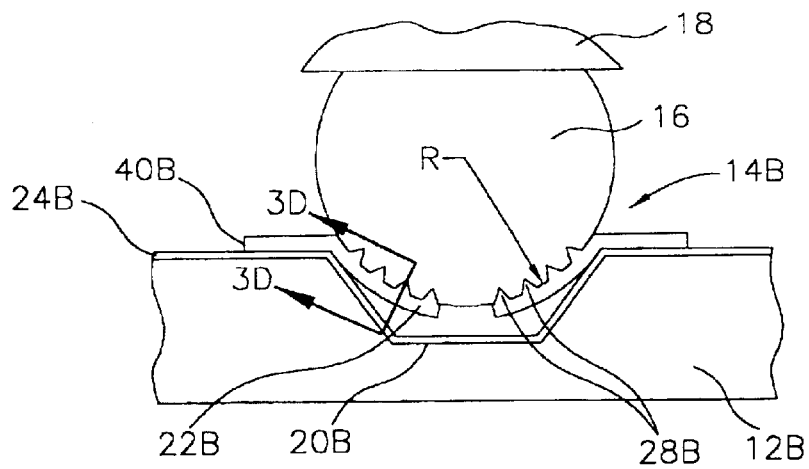
FIGURE 3B
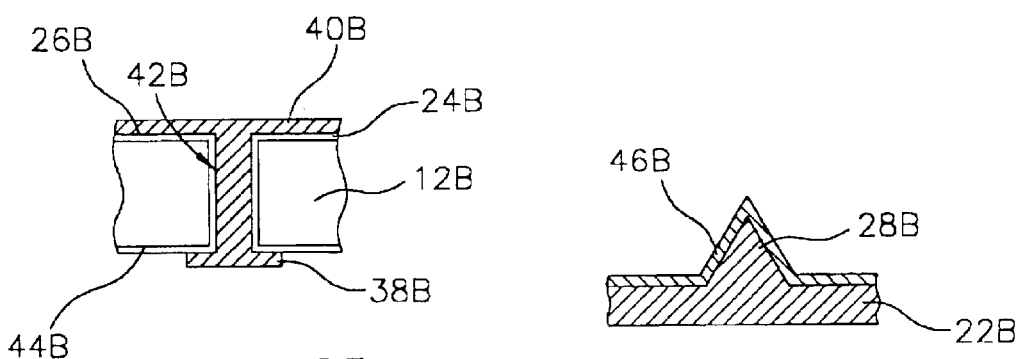
FIGURE 3C
FIGURE 3D

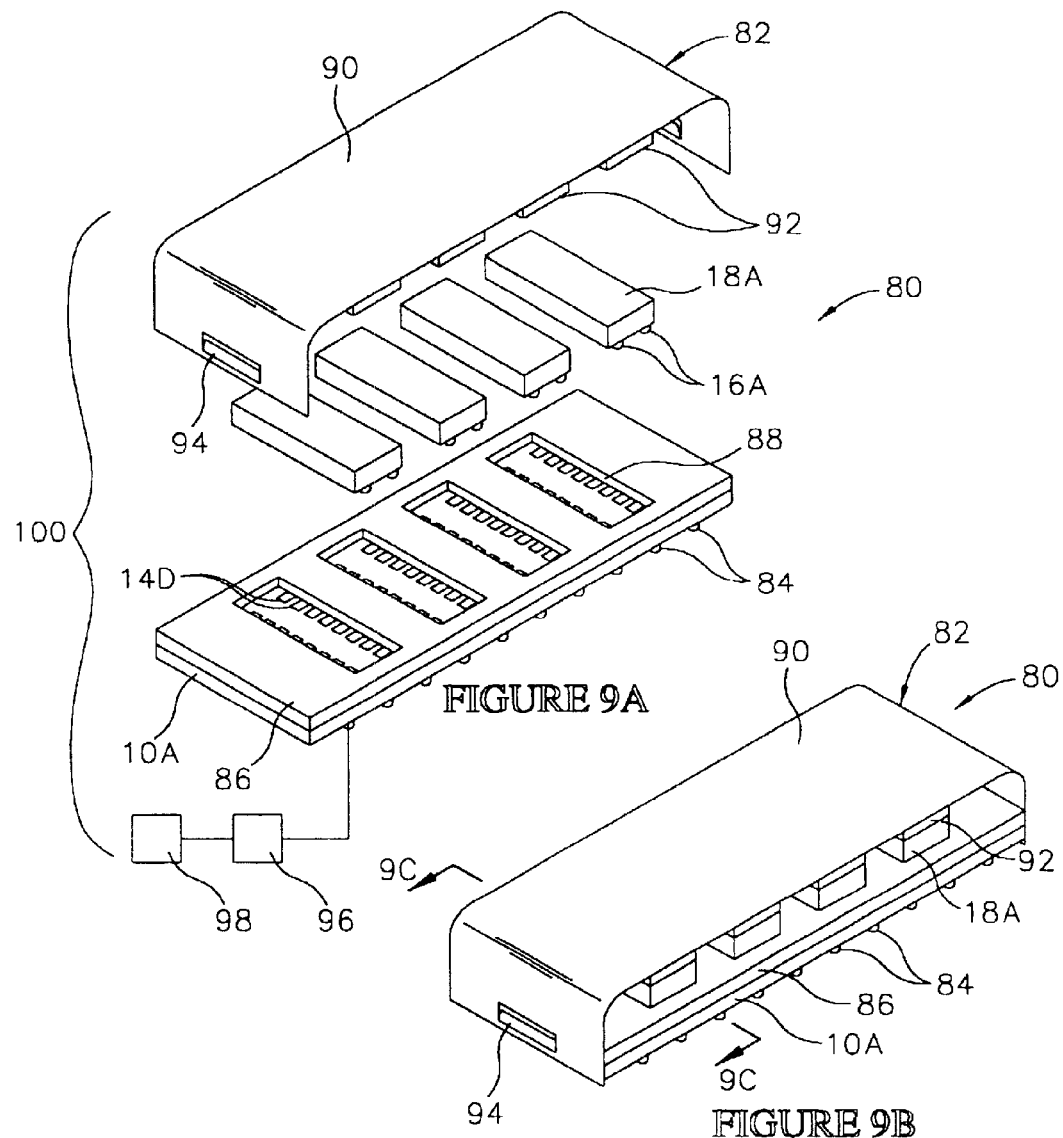
FIGURE 9A
FIGURE 9B
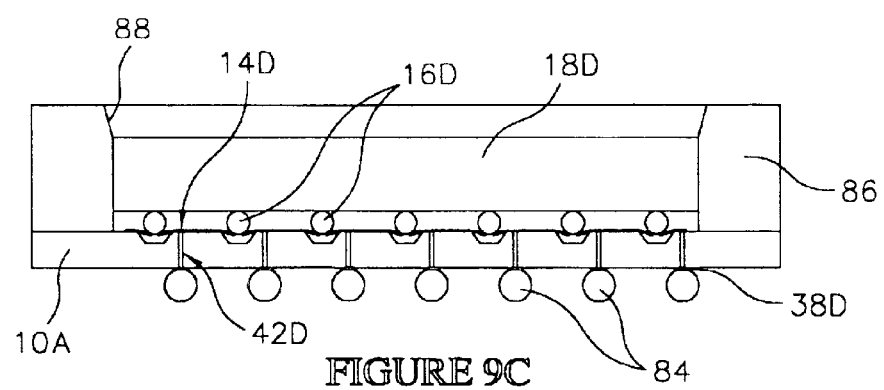
FIGURE 9C

TEST INTERCONNECT FOR BUMPED SEMICONDUCTOR COMPONENTS AND METHOD OF FABRICATION

FIELD OF THE INVENTION

This invention relates generally to the manufacture and testing of semiconductor components. More particularly, this invention relates to an interconnect for electrically engaging bumped semiconductor components.

BACKGROUND OF THE INVENTION

Semiconductor components, such as bare dice, chip scale packages, BGA devices and wafers can include terminal contacts in the form of bumped contacts. This type of component is sometimes referred to as a "bumped" component (e.g., bumped die, bumped wafer).

The bumped contacts provide a high input/output capability for a component, and permit the component to be surface mounted, or alternately flip chip mounted, to a mating substrate, such as a printed circuit board (PCB). Typically, the bumped contacts comprise solder balls, which permits the components to be bonded to the mating substrate using a solder reflow process. For some components, such as chip scale packages and BGA devices, the bumped contacts can be arranged in a dense array, such as a ball grid array (BGA), or a fine ball grid array (FBGA).

For performing test procedures on bumped semiconductor components it is necessary to make temporary electrical connections with the bumped contacts. Different types of interconnects have been developed for making these electrical connections. For example, a wafer probe card is one type of interconnect that is used to test semiconductor wafers. Another type of interconnect, is contained within a carrier for temporarily packaging singulated components, such as bare dice and chip scale packages, for test and burn-in. The interconnects include contacts that make the electrical connections with bumped contacts.

One problem with making these temporary electrical connections is that the sizes of the bumped contacts on a component can vary. Some bumped contacts can have a larger diameter and a greater height than other bumped contacts on the same component. Also, if the interconnect is used to test different components the sizes of the bumped contacts can vary between components. The interconnect contacts may not be able to accommodate these size differences, making reliable electrical connections difficult to make. This problem is compounded because the interconnect contacts must penetrate native oxide layers on the bump contacts to make low resistance electrical connections.

Another problem with bumped contacts particularly solder balls, is that the contacts deform easily during handling and testing, especially at elevated temperatures. For performing test procedures, it may be difficult to make low resistance electrical connections with deformed contacts. Specifically, the contacts on the interconnect may not adequately engage and penetrate the surfaces of the bumped contacts unless large contact forces are employed. However, the large contact forces can also deform the bumped contacts. For subsequent bonding procedures, deformed contacts can make alignment and bonding of the component with a mating substrate more difficult. In addition, deformed contacts are a cosmetic problem that can adversely affect a users perception of a semiconductor component.

The present invention is directed to an interconnect for making temporary electrical connections with semiconductor components having bumped contacts. The interconnect includes contacts constructed to center and retain the bumped contacts, and to accommodate variations in the size and planarity of the bumped contacts.

SUMMARY OF THE INVENTION

In accordance with the present invention, an improved interconnect for testing bumped semiconductor components, and a method for fabricating the interconnect are provided. The interconnect includes a substrate, a plurality of interconnect contacts on the substrate for electrically engaging bumped contacts on the components, and a plurality of conductors on the substrate for electrically connecting the interconnect contacts to test circuitry.

Suitable materials for the substrate include semiconducting materials, such as silicon, or electrically insulating materials, such as ceramic or plastic. With a semiconductor material, a coefficient of thermal expansion (CTE) for the interconnect exactly matches the CTE of some components, such as bare dice and wafers.

A first embodiment interconnect contact comprises a recess in the substrate, and a plurality of metal leads cantilevered over the recess. The leads are sized and shaped to support a bumped contact within the recess, and to flex in a z-direction within the recess, to accommodate variations in the diameters, or heights, of the bumped contacts. A length, width, thickness and modulus of elasticity of the leads can be selected to provide a desired flexibility or "spring constant". The leads can also include one or more penetrating projections, such as blades, for penetrating oxide layers on the bumped contacts. Preferably, the leads are formed of a non-bonding metal, or include an outer layer that will not bond to the bumped contacts. For example, for bumped contacts formed of solder, the leads can include a non-solder wettable outer layer.

The leads and the conductors to the leads can be formed on a surface of the substrate using a deposition process such as CVD, or electrodeposition. If the substrate comprises a semiconducting material, additional insulating layers must be formed on the substrate and within the recess to electrically insulate the leads and conductors. Alternately, the leads and conductors can be formed on a polymer tape, similar to multi layered TAB tape, that is attached to the substrate.

A second embodiment interconnect contact includes leads cantilevered over recesses and having a shape that substantially matches a topography of the bumped contacts. In addition, conductors for the contact comprise conductive vias extending through the substrate to an opposing surface of the substrate. The conductive vias include contact pads on the opposing surface that can have a greater pitch relative to a pitch of the interconnect contacts, or a "fan out" configuration.

A third embodiment interconnect contact comprises conductive beams in a recess that are at least partially covered with a non-bonding metal layer. The conductive beams are sized and shaped to support the bumped contacts, and to flex in the z-direction to accommodate size variations in the bumped contacts. A desired length, width, and thickness of the conductive beams can be achieved by controlling parameters of the etch process. In addition, the conductive beams can include projections for penetrating the bumped contacts to contact the underlying metal.

A method for fabricating the interconnect includes the steps of: providing a substrate; forming a metal layer on the substrate; etching projections in the metal layer; etching the metal layer to form patterns of leads; etching recesses in the substrate to cantilever the leads and form contacts for electrically engaging bumped contacts on a component; and then forming conductors to the leads. With the substrate comprising silicon, insulating layers can also be formed on the substrate, and within the recesses, for electrically insulating the leads and the conductors. With the conductors formed on a same surface of the substrate as the contacts, the same etching process can be used to form the conductors and the leads.

An alternate embodiment method for fabricating the interconnect includes the steps of: providing a substrate; forming a pattern of recesses in the substrate; providing a polymer tape comprising a plurality of leads and conductive traces; attaching the polymer tape to the substrate with the leads cantilevered over the recesses to form contacts for electrically engaging bumped contacts on a component.

For fabricating a die level test system, the interconnect can be configured for use with a test carrier configured to retain discrete semiconductor components, such as bare dice and packages, for electrical connection to test circuitry. For fabricating a wafer level test system, the interconnect can be configured for use with a wafer prober configured to apply test signals to dice contained on a semiconductor wafer.

BRIEF DESCRIPTION OF THE DRAWINGS

FIG. 3A is an enlarged plan view taken along line 3A of FIG. 1 illustrating a second embodiment interconnect contact;

FIG. 3B is an enlarged cross sectional view taken along section line 3B—3B of FIG. 3A illustrating leads of the second embodiment interconnect contact electrically engaging a bumped contact on a component;

FIG. 3C is an enlarged cross sectional view taken along section line 3C—3C of FIG. 3A illustrating a conductive via for the second embodiment interconnect contact;

FIG. 3D is an enlarged cross sectional view taken along section line 3D—3D of FIG. 3B illustrating blades on the leads;

FIG. 9A is an exploded schematic perspective view of a test carrier that includes an interconnect constructed in accordance with the invention;

FIG. 9B is a schematic perspective view of the assembled test carrier;

FIG. 9C is an enlarged schematic cross sectional view, with parts removed, of the test carrier taken along section line 9C—9C of FIG. 9B;

DETAILED DESCRIPTION OF THE PREFERRED EMBODIMENT

Figure 1:
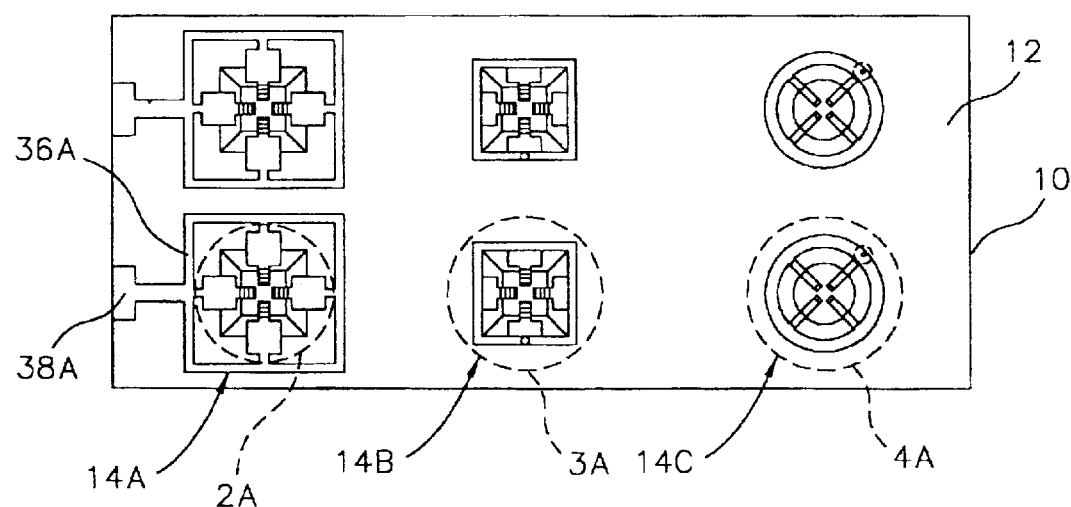
FIG. 1 is a schematic plan view of an interconnect constructed in accordance with the invention illustrating different embodiments of contacts on the interconnect.

Referring to FIG. 1, an interconnect 10 constructed in accordance with the invention is illustrated. The interconnect 10 includes a substrate 12, and a pattern of contacts 14A, 14B, 14C formed on the substrate 12. The contacts 14A, 14B, 14C are adapted to electrically engage bumped contacts 16 (FIG. 2C) on a semiconductor component 18 (FIG. 2C).

As used herein, the term "semiconductor component" refers to an electronic component that includes a semiconductor die. Exemplary semiconductor components include bare semiconductor dice, chip scale packages, ceramic or plastic semiconductor packages, semiconductor wafers, BGA devices, and multi chip modules.

For illustrative purposes, three different contact embodiments are illustrated in FIG. 1. However, in actual practice the interconnect 10 will contain only one type of contact 14A, 14B, 14C. Also for illustrative purposes, only two contacts for each embodiment are illustrated on the interconnect 10. However, in actual practice the interconnect 10 will contain enough contacts 14A, 14B, 14C to electrically engage all of the bumped contacts 16 (FIG. 2C) on the component 18 (FIG. 2C) at the same time. In addition, a pattern of the contacts 14A, 14B, 14C will exactly match a pattern of the bumped contacts 16 (FIG. 2C) on the component 18 (FIG. 2C).

Figure 2A:
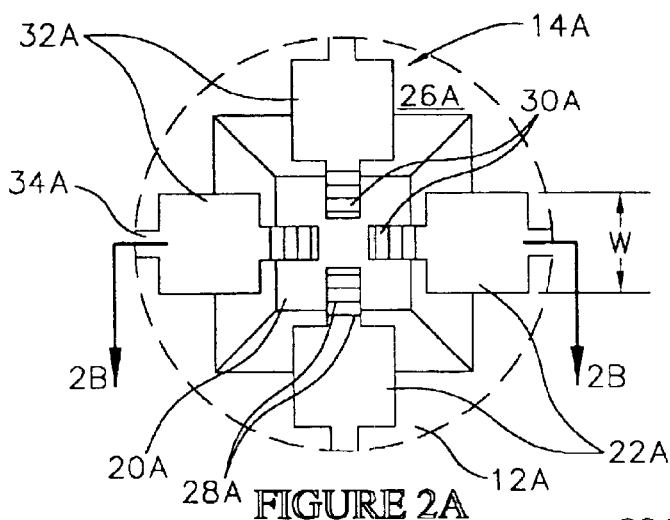
FIG. 2A is an enlarged plan view taken along line 2A of FIG. 1 illustrating a first embodiment interconnect contact.
Figure 2B:
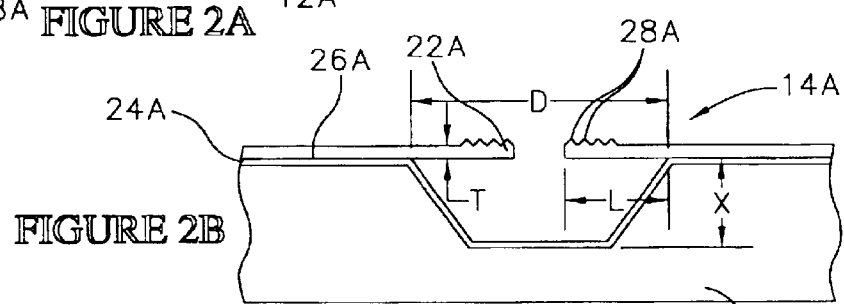
FIG. 2B is a cross sectional view taken along section line 2B—2B of FIG. 2A.
Figure 2C:
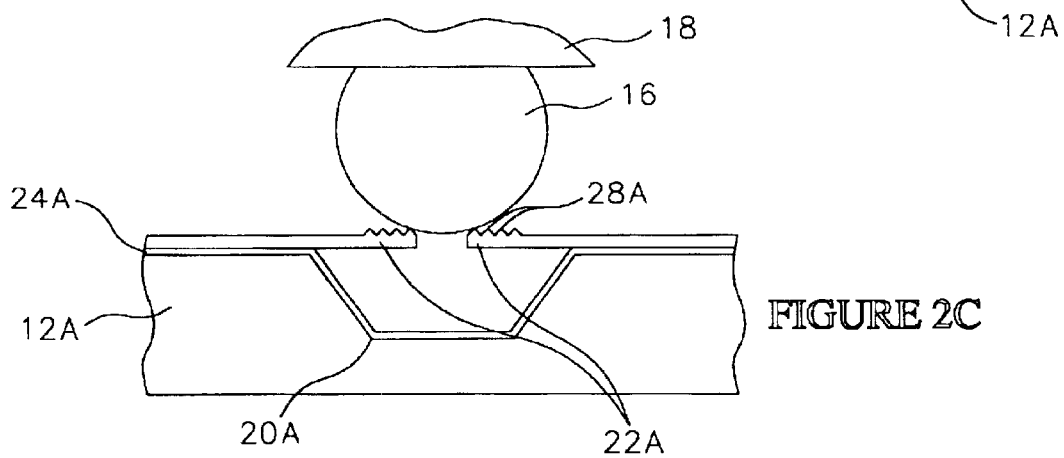
FIGS. 2C and 2D are schematic cross sectional views of the interconnect contact of FIG. 2B electrically engaging a bumped contact on a component.

Referring to FIGS. 2A–2C, the first embodiment contact 14A comprises a recess 20A in a substrate 12A, and a plurality of metal leads 22A cantilevered over the recess 20A. The recess 20A and leads 22A are sized and shaped to compensate for variations in the size (e.g., diameter, height), shape, and planarity of the bumped contacts 16 (FIG. 2C) on the component 18 (FIG. 2C).

The substrate 12A can comprise a semiconductor material such as monocrystalline silicon, germanium, silicon-on-glass, or silicon-on-sapphire. In addition, an electrically insulating layer 24A (FIG. 2B) can be formed on a surface 26A of the substrate 12A and within the recess 20A for electrically insulating the contact 14A from a bulk of the substrate 12A. However, as will be further explained the substrate can also comprise an electrically insulating material, such as ceramic or plastic, such that electrically insulating layers are not be required.

The recess 20A can be formed in the substrate 12A using an etching process, a laser machining process or a molding process. In the embodiment illustrated in FIG. 2B, the recess 20A is generally square shaped, and the contact 14A includes four leads 22A extending generally orthogonally to the sides of the recess 20A. Alternately the recess 20A can have other shapes, such as rectangular, circular, or oval, and the leads can be formed in different patterns than the lone shown (e.g., spoke pattern). Also, the contact 14A can include a lesser, or a greater number of leads 22A, with at least two or more leads necessary to support and center the bumped contact 16.

The leads 22A can be formed directly on the substrate 12A using a metallization process such as CVD or electrodeposition. Alternately, as will be further explained, the leads 22A can be formed separately on a polymer substrate similar to TAB tape, which is attached to the substrate 12A.

In the illustrative embodiment, the leads 22A have terminal portions 30A for contacting the bumped contacts 16. In addition, the leads 22A include generally rectangular shaped support portions 32A that are larger in size than the terminal portions 30A, and at least partially in contact with the surface 26A of the substrate 12A. The larger size of the support portions 32A provides an increased surface area for attaching and pivoting the leads 22A on the substrate 12A.

The leads 22A also include connecting portions 34A in electrical communication with conductive traces 36A (FIG. 1) and contact pads 38A (FIG. 1) on the surface 26A of the substrate 12A. The conductive traces 36A and contact pads 38A provide electrical paths from the contact 14A to test circuitry. In the illustrative embodiment, the conductive traces 36A are formed in a generally square pattern which substantially matches, but is slightly larger than a peripheral shape of the recess 20A.

As shown in FIG. 2B, the leads 22A can also include blades 28A formed on the terminal portions 30A thereof, for penetrating into the bumped contacts 16. The blades 28A are configured to penetrate native oxide layers on the bumped contacts 16, to contact the underlying metal and facilitate formation of low resistance electrical connections. In the illustrative embodiment, the blades 28A comprise elongated pointed members, formed in parallel spaced patterns. Alternately, other penetrating shapes, such as conical points or flat top projections, can be used for the blades 28A. As will be further explained, the blades 28A can be formed using an etching process to be hereinafter described.

The recess 20A is sized and shaped to retain and center the bumped contacts 16. As shown in FIG. 2B, the recess 20A has a diameter D and a depth X. The diameter D and depth X are approximately equal to the diameter and height of the bumped contacts 16. Preferably, the diameter D (FIG. 2B) of the recess 20A is equal to, or greater than, a diameter of the bumped contacts 16. A representative range for the diameter D (FIG. 2B) can be from 2 mils to 50 mils. In addition, the depth X (FIG. 2B) of the recess 20A can be selected such that the blades 22A, can move in the z-direction within the recess 20A, by a distance sufficient to accommodate variations in the size, shape and planarity of the bumped contacts 16. For example, the depth X (FIG. 2B) of the recess 20A can be equal to, or less than, a height of the bumped contacts 16. A representative range for the depth X (FIG. 2B) can be from 1 mils to 25 mils.

The leads 22A have a cantilevered length L, and a width W (FIG. 2A). The thickness T, length L, and width W can be selected to provide a desired flexibility, or spring constant C for the leads 22A. The spring constant C can be determined by the formula $C=(EWT^3)/4L^3$, where E is the modulus of elasticity of the metal which forms the leads 22A. Preferably the leads 22A comprise a high yield strength metal such as tungsten, titanium, nickel, platinum, iridium, or vanadium. Also, as will be further explained, the leads 22A can include an outer layer formed of a material formulated to prevent bonding of the leads 22A to the bumped contacts 16 (FIG. 2B).

Figure 2D:
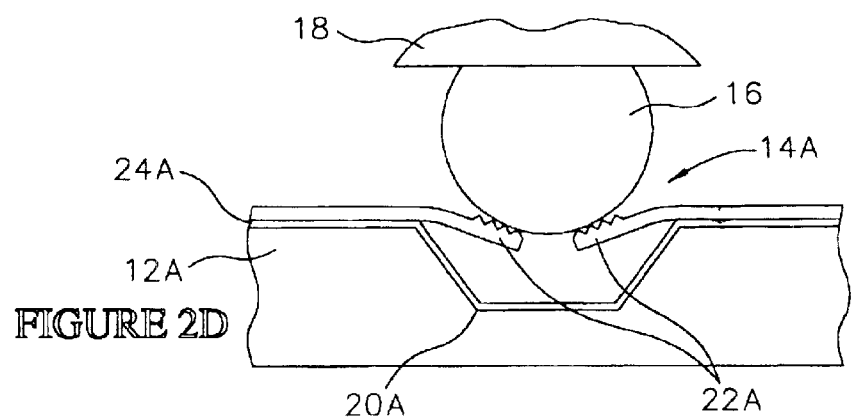

As shown in FIGS. 2C and 2D, during a test procedure, the bumped contacts 16 can be pressed into the recess 20A with the leads 22A flexing to electrically engage the bumped contacts 16. Pressing of the bumped contacts 16 into the recess 20A can be accomplished by applying an external biasing force to the interconnect 10, or to the component 18, in a manner to be hereinafter described.

Referring to FIGS. 3A–3D, the second embodiment contact 14B is illustrated. The contact 14B comprises a recess 20B formed in a substrate 14B, substantially as previously described. In addition, the contact 14B comprises a plurality of leads 22B cantilevered over the recess 20B, and having blades 28B for penetrating the contact bumps 16 substantially as previously described. However, in this embodiment the leads 22B have a curved shape that substantially matches a shape of the outer surface of the bumped contacts 16. Specifically the leads 22B have a radius of curvature R approximately equal to a radius of the bumped contacts 16. As with the previous embodiment, the leads 22B are configured to flex in the z-direction within the recess 20B to compensate for variations in the size or planarity of the bumped contacts 16.

The contact 14B also includes a conductive connecting segment 40B for electrically interconnecting the leads 22B. The conductive connecting segment 40B comprises a thin metal layer formed on a surface 26B the substrate 12B proximate to the recess 20B. In the illustrative embodiment, the conductive connecting segment 40B encircles an upper periphery of the recess 20B. In addition, the connecting segment 40B is in electrical communication with a conductive via 42B formed in the substrate 12B, and a contact pad 38B formed on a backside of the substrate 12B. The contact pad 38B and conductive via 42B provide a conductive path from test circuitry to the contact 14B as will hereinafter be described. As with the first embodiment contact 14A, an electrically insulating layer 24B electrically insulates the contact 14B and the conductive via 42B from the substrate 12B. However, if the substrate 12B is formed of an electrically insulating layer such as ceramic or plastic the insulating layer 24B is not required.

As shown in FIG. 3D, the leads 22B also include an outer layer 46B, which comprises a material selected to provide a non-bonding surface for the bumped contacts 16. For example, for bumped contacts 16 formed of solder, the outer layer 46B can comprise a metal that is not solder wettable. Suitable metals include Ti, $TiSi_2$ and Al. Rather than metal, the outer layer 46B can comprise a conductive polymer selected to provide a non-bonding surface. Suitable conductive polymers include carbon films and metal filled silicone.

Figure 4A:
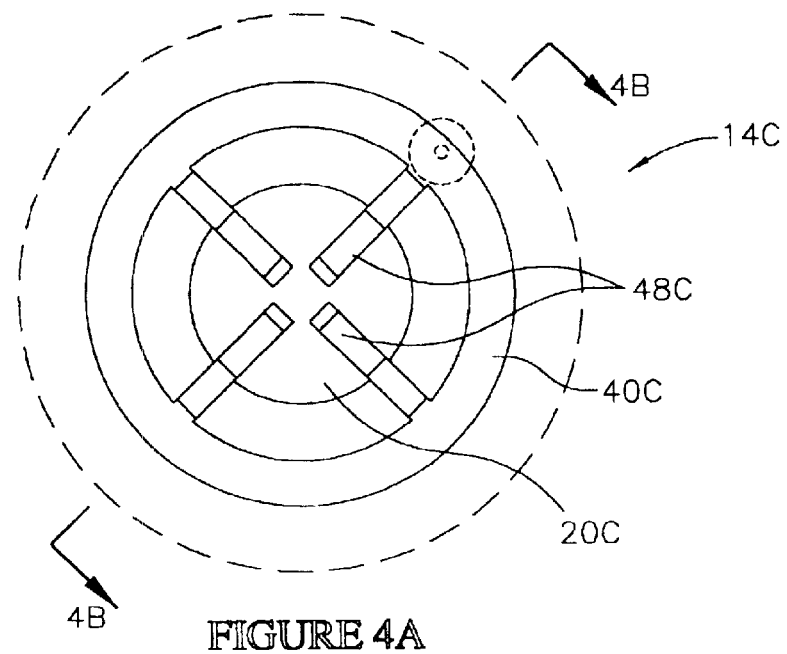
FIG. 4A is an enlarged plan view taken along line 4A—4A of FIG. 1 illustrating a third embodiment interconnect contact.
Figure 4B:
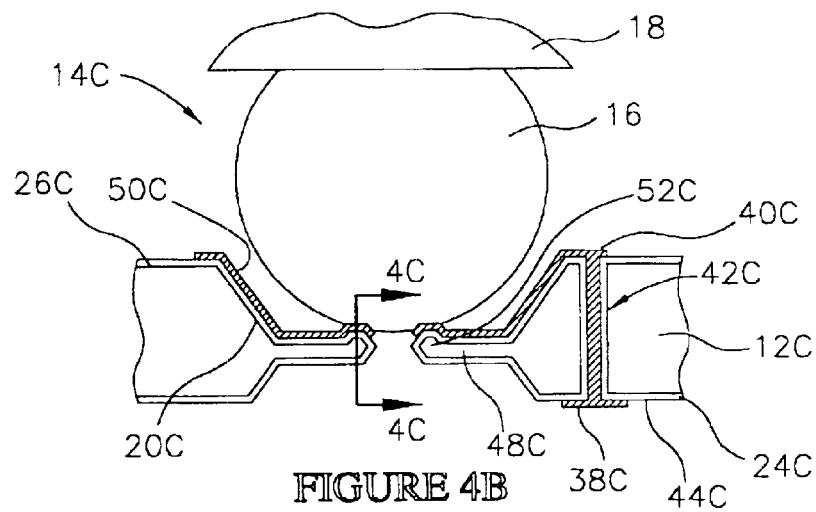
FIG. 4B is an enlarged cross sectional view taken along section line 4B—4B of FIG. 4A illustrating etched beams of the third embodiment interconnect contact electrically engaging a bumped contact on a component.
Figure 4C:
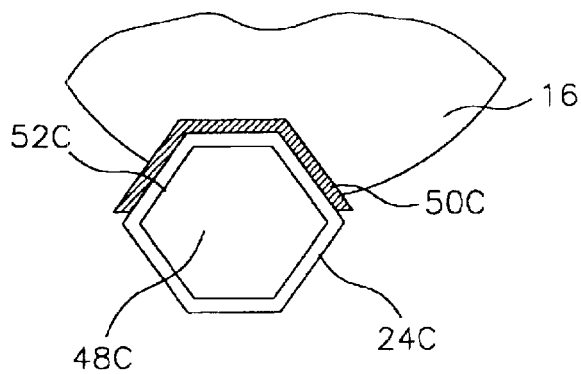
FIG. 4C is an enlarged cross sectional view taken along section line 4C—4C of FIG. 4B illustrating a penetrating projection on an etched beam penetrating into the bumped contact.

Referring to FIGS. 4A–4C, the third embodiment contact 14C is illustrated. The contact 14C comprises: a substrate 12C; a recess 20C formed in the substrate 12C; and conductive beams 48C cantilevered over the recess 20C.

The recess 20C has a generally circular peripheral configuration and can be formed using an etch process substantially as previously described. In addition, the conductive beams 48C can be formed integrally with the substrate 12C using an etching process to be hereinafter described. As with the leads 22A (FIG. 2B), a length, thickness, width, and modulus of elasticity of the conductive beams 48C can be selected to provide a desired spring constant.

The conductive beams 48C are at least partially covered with metal layers 50C. The metal layers 50C are electrically interconnected by a connecting segment 40C on a surface 26C of the substrate 12C which encircles a periphery of the recess 20C. In addition, the metal layers 50C are in electrical communication with a conductive via 42C in the substrate 12C, and a contact pad 38C formed on a backside surface 44C of the substrate 12C. Electrically insulating layers 24C electrically insulate the metal layers 50C, the connecting segment 40C, and the conductive via 42C. As shown in FIG. 4C, the conductive beams 48C also include penetrating projections 52C configured to penetrate into the bumped contacts 16. The penetrating projections 52C can be formed using an etching process to be hereinafter described.

Figure 5A:
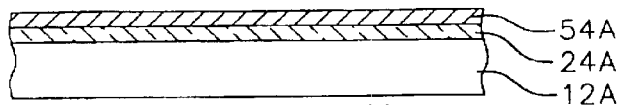
FIGS. 5A–5F are schematic cross sectional views illustrating steps in a method for fabricating the first embodiment interconnect contact.

Referring to FIGS. 5A–5H, steps in a method for fabricating the interconnect 10 (FIG. 1) with the first embodiment contact 14A are illustrated. Initially as shown in FIG. 5A, the substrate 12A is provided. In the illustrative method, the substrate 12A comprises monocrystalline silicon. Preferably, the substrate 12A is provided as a wafer of material on which multiple interconnects 10 (FIG. 1) can be fabricated and then singulated by saw cutting or shearing.

As also shown in FIG. 5A, the insulating layer 24A is formed on the substrate. The insulating layer 24A can comprise an electrically insulating material, such as $SiO_2$ or $Si_3N_4$ deposited using a process such as CVD. A $SiO_2$ layer can also be grown using an oxidizing atmosphere such as steam and $O_2$ at an elevated temperature (e.g., 950° C.). Alternately, the insulating layer 24A can comprise a deposited polymer such as polyimide. One method for depositing a polymer is with a spin on process. Depending on the material, a representative thickness of the insulating layer 24A can be from about 100 Å to several mils.

In addition to the insulating layer 24A, a metal layer 54A is formed on the insulating layer 24A. The metal layer 54A can comprise a thin film deposited using a suitable deposition process such as CVD. Alternately, the metal layer 54A can comprise a foil or sheet, attached to the substrate using an adhesive, or a lamination process. A representative thickness of the metal layer 54A can be from 1 μm to 100 μm or more. Preferably the metal layer 54A comprises a high yield strength metal, such as tungsten, titanium, nickel, platinum, iridium, or vanadium.

Figure 5B:
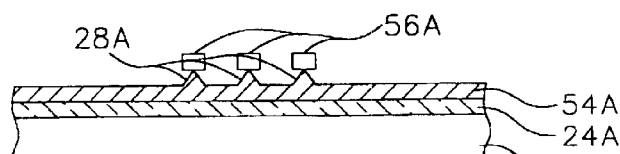

Next, as shown in FIG. 5B, for etching the blades 28A, a mask 56A, such as a hard mask, or a resist mask, is formed on the metal layer 54A. The blades 28A can be etched using a suitable wet etchant and a set etch process. Alternately, a dry etch process such as plasma etching, ion milling or reactive ion etching can be employed. As another alternative, the blades 28A can be formed by depositing a rough metal layer using an electrolytic plating process. Such a process is described in U.S. Pat. No. 5,487,999, which is incorporated herein by reference. A representative height of the blades 28A can be from 5000 Å to 50 μm or more. Following formation of the blades 28A, the mask 56A is stripped.

Figure 5C:
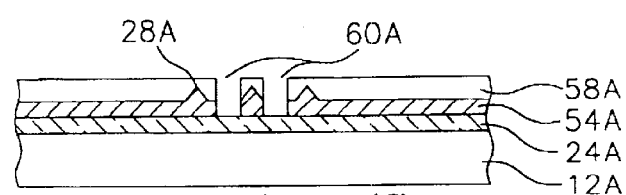

Next, as shown in FIG. 5C, a mask 58A, such as a resist mask, or a hard mask, is formed on the metal layer 54A. The mask 58A includes openings 60A for applying a wet etchant to remove unwanted portions of the metal layer 54A for patterning.

Figure 5D:
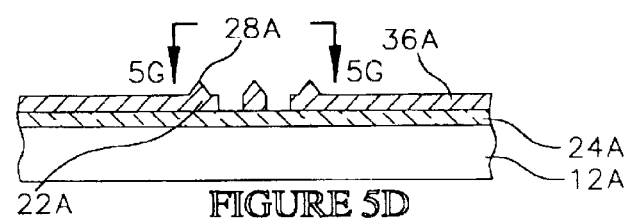

Next, as shown in FIG. 5D, following etching of the metal layer 54A, the mask 58A is stripped. The etch step forms the leads 22A for the contacts 14A. FIG. 5G illustrates the pattern of the leads 22A. During etching of the leads 22A, the conductive traces 36A and contact pads 38A (FIG. 1) can also be formed by removing unwanted portions of the metal layer 54A.

Figure 5E:
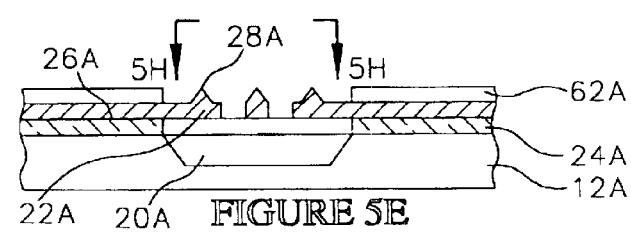
Figure 5F:
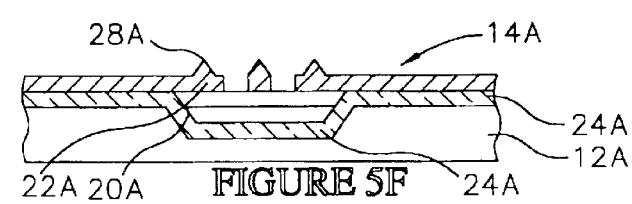

Next, as shown in FIG. 5E, a mask 62A, such as a resist mask or a hard mask, is formed, and the recess 20A is etched into the substrate 12A using the mask 62A. FIG. 5H illustrates the location of the leads 22A relative to the recess 20A. In general, the leads 22A are cantilevered over the recess 20A, as previously described. In addition, the depth of the recess 20A is selected to allow the leads 22A to flex in the z-direction as previously described.

The recess 20A can be etched using an anisotropic etch process. With an anisotropic etch process, the recess 20A will have straight sidewalls, sloped at an angle of about 55° with respect to the surface 26A of the substrate 12A. With the substrate 12A comprising silicon, one suitable etchant for performing an anisotropic etch is a solution of $KOH:H_2O$.

Figure 5I:
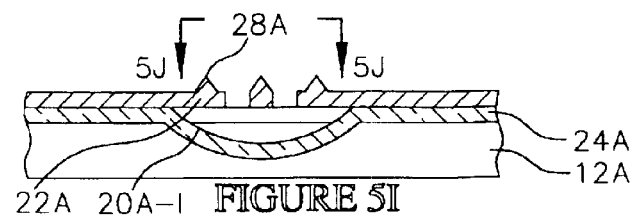
FIG. 5I is a schematic plan view equivalent to FIG. 5E but illustrating a process step for forming a recess for an alternate embodiment interconnect contact using an isotropic etch process.
Figure 5G:
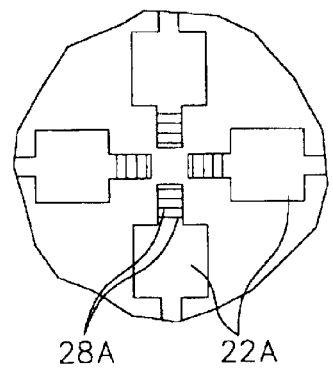
FIG. 5G is an enlarged plan view taken along section line 5G—5G of FIG. 5D.
Figure 5H:
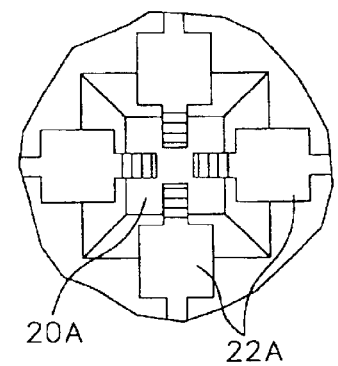
FIG. 5H is an enlarged plan view taken along section line 5H—5H of FIG. 5E.
Figure 5J:
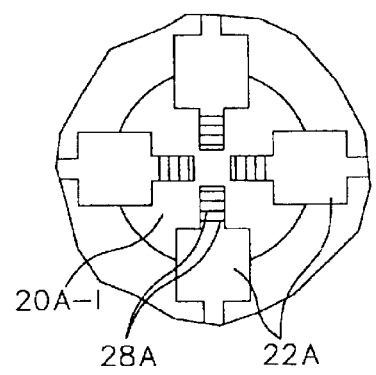
FIG. 5J is an enlarged plan view taken along section line 5J—5J of FIG. 5I.

Alternately, as shown in FIG. 5I, rather than an anisotropic etch process, an isotropic etch process can be used, to form a recess 20A–I. In this case, the recess 20A–I has curved sidewalls. In addition, as shown in FIG. 5J, the recess 20A–I has a circular peripheral configuration. With the substrate 12A comprising silicon, one suitable etchant for performing an isotropic etch is a mixture of HF, $HNO_3$ and $H_2O$.

Next, as shown in FIG. 5F, the insulating layer 24A is grown or deposited in the recess 20A using a growth or deposition process as previously described. This step completes the contact 14A.

Referring to FIGS. 6A–6F, steps in a method for fabricating the interconnect 10 (FIG. 1) with an alternate embodiment contact 14A' are illustrated. The contact 14A' is substantially equivalent to the first embodiment contact 14A previously described but is fabricated using a polymer tape 21 rather than a deposition process.

Figure 6A:
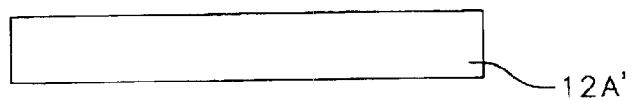
FIGS. 6A–6C are schematic cross sectional views illustrating steps in a method for fabricating the first embodiment interconnect contact.

Initially as shown in FIG. 6A, a substrate 12A' is provided. In this embodiment the substrate 12A' comprises plastic. Exemplary plastics include epoxy novolac resin, silicone, phenylsilane and thermoset plastics. Alternately the substrate 12A' can comprise silicon or ceramic.

Figure 6B:
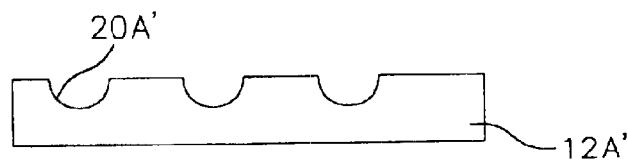

Next, as shown in FIG. 6B, recesses 20A' are formed in the substrate 12A' using a molding process. The recesses 20A' are substantially equivalent to the etched recesses 20A (FIG. 2A) previously described. However, in this embodiment, the recesses 20A' have a circular peripheral configuration, and a generally hemispherically shaped cross section. As before, the recesses 20A' have a diameter of from about 2 mils to 50 mils and a depth of about 1 mils to 25 mils. With features this small, the molding process is sometimes referred to a "micro molding". Alternately a laser machining process can be used to form the recesses 20A'.

Figure 6C:
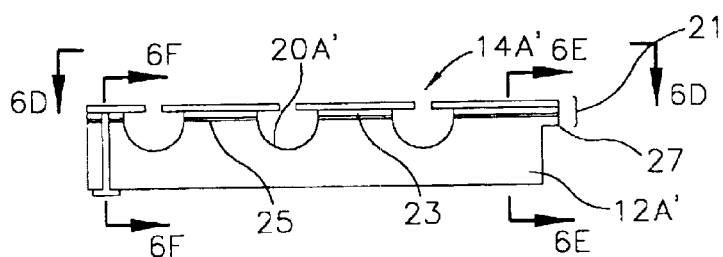
Figure 6E:
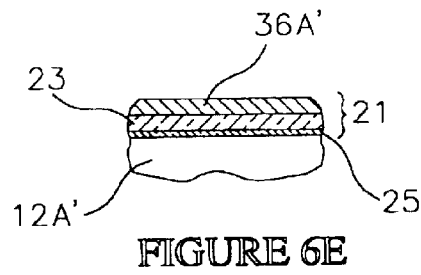
FIG. 6E is an enlarged cross sectional view taken along section line 6E—6E of FIG. 6C.
Figure 6D:
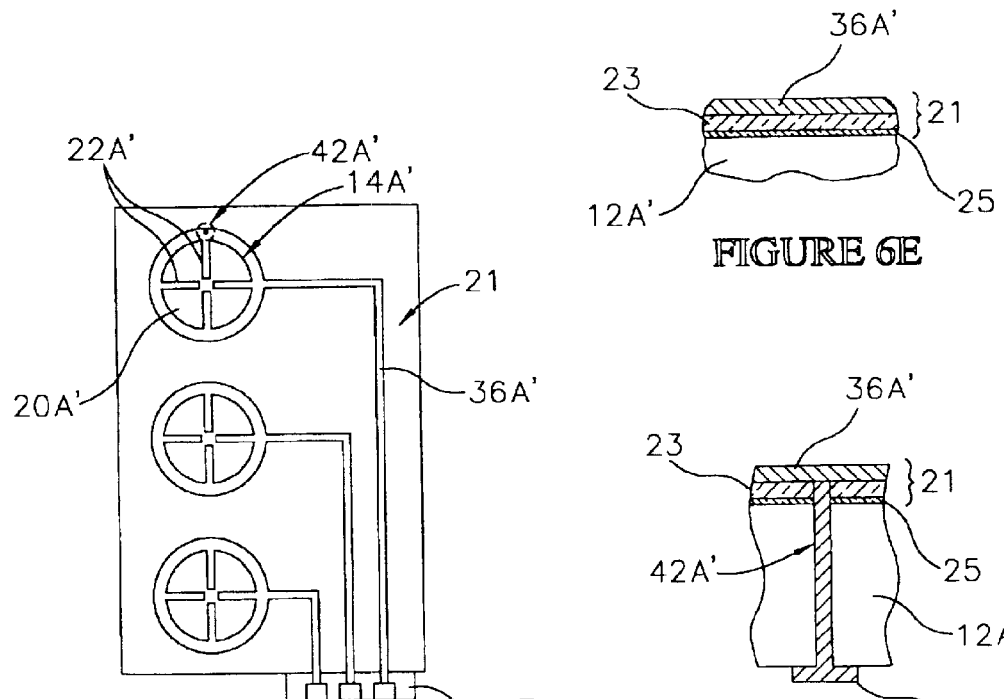
FIG. 6D is a schematic plan view taken along section line 6D—6D of FIG. 6C.

Next, as shown in FIG. 6C, a polymer tape 21 is provided. The polymer tape 21 can be a separately formed member similar to multi layered TAB tape used widely in semiconductor packaging. As shown in FIG. 6E, the polymer tape 21 includes a thin flexible polymer substrate 23, such as polyimide. In addition, as shown in FIG. 6D, the polymer tape 21 includes leads 22A' substantially equivalent to the leads 22A (FIG. 2B) previously described. The polymer tape 21 also includes conductive traces 36A' substantially equivalent to the conductive traces 36A (FIG. 1) previously described. The leads 22A' and conductive traces 36A' can be formed by depositing (e.g., electrodeposition) or attaching (e.g., lamination) a metal layer to the polymer substrate 23 and then patterning the metal layer. Also openings or vias can be formed in the polymer substrate 23 in a pattern that corresponds to the pattern of the recesses 20A'.

Figure 6F:
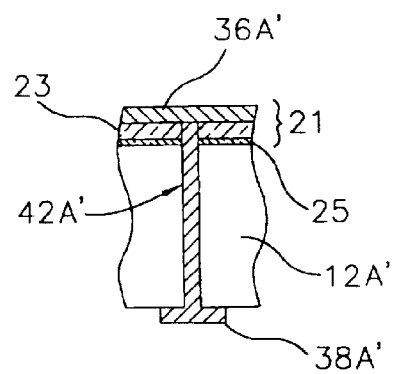
FIG. 6F is an enlarged cross sectional view taken along section line 6F—6F of FIG. 6C.

The conductive traces 36A are in electrical communication with an electrical connector 27, which is configured to electrically connect the conductive traces 36A' to external test circuitry. The electrical connector 27 can be in the form of a male connector, or a female connector, as is known in the art. Alternately as shown in FIG. 6F, rather than the electrical connector 27, a conductive via 42A' with a contact pad 38A' can be formed in the substrate 12A' to electrically connect the conductive traces 36A to external test circuitry. The conductive via 42A' can be formed using a process to be hereinafter described. As shown in FIG. 6E, an adhesive layer 25 can be used to attach the polymer tape 21 to the substrate 12A'. One suitable adhesive is a silicone elastomer such as "ZYMET" manufactured by Zymet, Inc. East Hanover, N.J. Alternately, other adhesives such as "KAPTON" tapes, or two part epoxies, can be employed. Prior to attaching the polymer tape 21 to the substrate 12A', the leads 22A' are aligned with the recesses 20A'.

Referring to FIGS. 7A–7I, steps in a method for fabricating the interconnect 10 (FIG. 1) with the second embodiment contact 14B are illustrated. Initially the substrate 14B, insulating layer 24B and metal layer 54B are formed substantially as previously described for FIG. 5A.

Figure 7A:
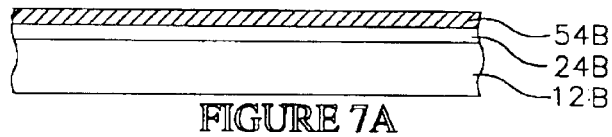
FIGS. 7A–7G are schematic cross sectional views illustrating steps in a method for fabricating the second embodiment interconnect contact.
Figure 7B:
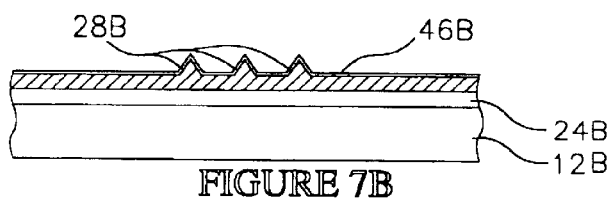

Next, as shown in FIG. 7B, blades 28B are formed also as previously described. In addition, the non-bonding outer layer 46A can be formed on the metal layer 54B using a suitable deposition process such as CVD, electrodeposition deposition, or electroless deposition of a metal or conductive polymer layer.

Figure 7C:
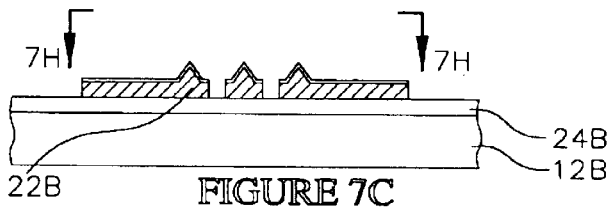

Next, as shown in FIG. 7C, the leads 22B are formed using an etching process as previously described. In addition, as shown in FIG. 7H, the connecting segment 40B for the leads 22B can be formed during the same etching process.

Figure 7D:
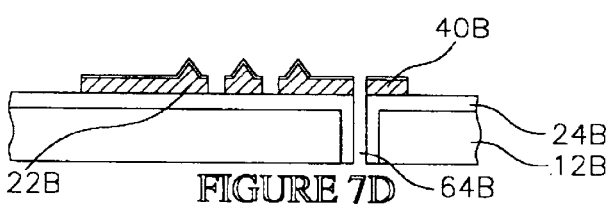

Next, as shown in FIG. 7D, an opening 64B is formed through the connecting segment 40B and through the substrate 14B. One method for forming the opening 64B is with a laser machining process. A suitable laser machining apparatus for forming the opening 64B is manufactured by General Scanning of Sommerville, Mass. and is designated a Model No. 670-W. Another suitable laser machining apparatus is manufactured by Synova S.A., Lausanne, Switzerland.

A representative diameter of the opening 64B can be from 10 µm to 2 mils or greater. A representative fluence of a laser beam for forming the opening 64B with the substrate 14B comprising silicon and having a thickness of about 28 mils, is from 2 to 10 watts/per opening at a pulse duration of 20–25 ns and at a repetition rate of up to several thousand per second. The wavelength of the laser beam can be a standard infrared or green wavelength (e.g., 1064 nm-532 nm), or any wavelength that will interact with and heat silicon.

Following formation of the opening 64B, the electrically insulating layer 24B can also be formed in the opening. The insulating layer 24B can comprise an insulating material, such as $SiO_2$, or $Si_3N_4$, deposited to a desired thickness using CVD, or other deposition process. The insulating layers 24B can also comprise an insulating polymer, such as polyimide, deposited and planarized using a suitable process (e.g., spin-on-process). In the case of an insulating polymer, an injection or capillary process can be used to deposit the polymer layer into the opening 64B.

Figure 7E:
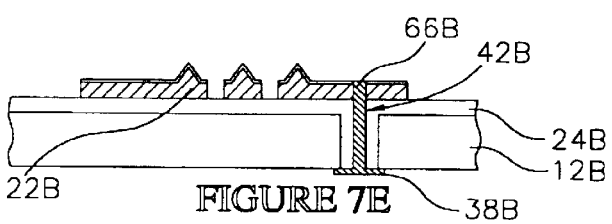

Next, as shown in FIG. 7E, a conductive material 66A is deposited within the opening 64B. The conductive material 66A can comprise a metal, such as solder, aluminum, titanium, nickel, iridium, copper, gold, tungsten, silver, platinum, palladium, tantalum, molybdenum, or alloys of these metals. The metal can be deposited within the opening 64B using a deposition process, such as CVD, electrolytic deposition or electroless deposition. Alternately, a solder alloy can be screen printed into the opening 64B, or injected by capillary action, or with a vacuum system using a hot solder wave. In addition, the conductive material 66A can comprise plugs that completely fill the opening 64B, or alternately can comprise layers that cover just the inside surfaces or sidewalls of the opening 64B.

Also, rather than being a metal, the conductive material 66A can comprise a conductive polymer, such as a metal filled silicone, a carbon filled ink, or an isotropic or anisotropic adhesive. Suitable conductive polymers are sold by A.I. Technology, Trenton, N.J.; Sheldahl, Northfield, Minn.; 3M, St. Paul, Minn. A conductive polymer can be deposited within the openings 64B, as a viscous material, and then cured as required. A suitable deposition process, such as screen printing, or stenciling, can be used to deposit the conductive polymer into the opening 64B.

At the same time the conductive material 66A is deposited in the opening 64B, the contact pad 38B can be formed on the substrate 14B. A suitable mask (not shown) can be used during deposition of the conductive material 66A to form the contact pad 38B with a desired thickness and peripheral shape. Alternately, the contact pad 38B can comprise a different material than the conductive material 66A formed using a separate deposition or metallization process. For example, the contact pad 38B can comprise a wire bondable or solderable metal such as copper or aluminum, while the conductive material 66A can comprise a material such as nickel.

Figure 7F:
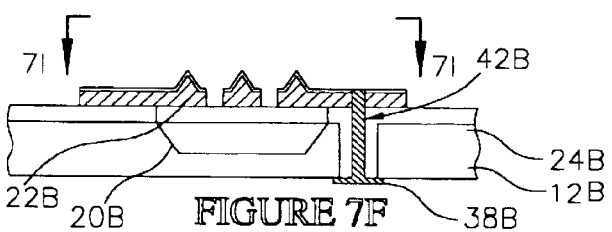

Next, as shown in FIG. 7F, the recess 20B can be etched in the substrate 14B, substantially as previously described for recess 20A (FIG. 5F). As shown in FIG. 7I, the connecting segment 40B encircles the recess 20B and the leads 22B cantilever over the recess 20B.

Figure 7G:
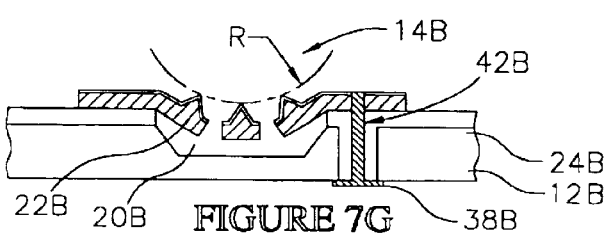
Figure 7H:
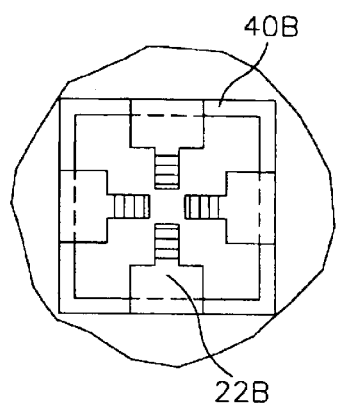
FIG. 7H is an enlarged plan view taken along section line 7H—7H of FIG. 7C.
Figure 7I:
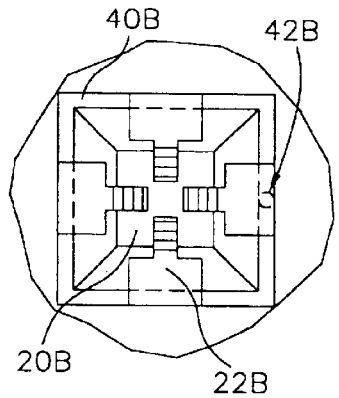
FIG. 7I is an enlarged plan view taken along section line 7I—7I of FIG. 7F.

Next, as shown in FIG. 7G, the insulating layer 24B can be formed in the recess 20B as previously described. In addition, the leads 22B can be shaped with a radius of curvature R. Shaping of the leads 22B can be accomplished using a radiused tool configured to press and heat the leads 22B.

Referring to FIGS. 8A–8H, steps in a method for fabricating the interconnect 10 (FIG. 1) with the third embodiment contact 14C are illustrated. Initially the substrate 12C is provided.

Figure 8A:
FIGS. 8A–8F are schematic cross sectional views illustrating steps in a method for fabricating the third embodiment interconnect contact.
Figure 8B:
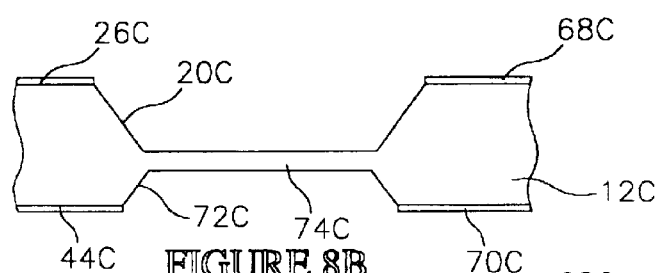

Next, as shown in FIG. 8B, a first mask 68C is formed on a surface 26C of the substrate 12C. An anisotropic etch process is then performed substantially as previously described, forming the recess 20C in the surface 26C. A second mask 70C is also formed on a backside surface 44C of the substrate 12C and a second recess 72C is anisotropically etched in the backside surface 44C. The separate etch steps form a connecting beam 74C in the substrate 12C which separates the recess 20C and the second recess 72C. In the illustrative embodiment the etch processes are controlled such that recess 20C is deeper than the recess 72C. However, etching of the two surfaces could alternately be performed at the same time in which cases the recesses 20C and 72C would be mirror images of one another.

Figure 8G:
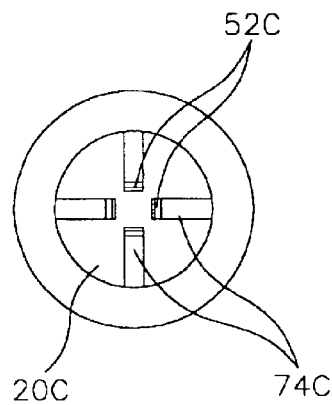
FIG. 8G is an enlarged plan view taken along section line 8G—8G of FIG. 8D.
Figure 8C:
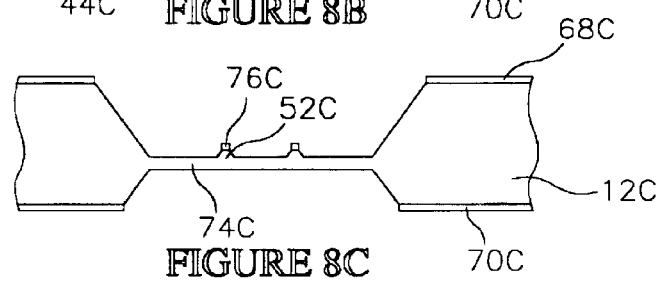
Figure 8H:
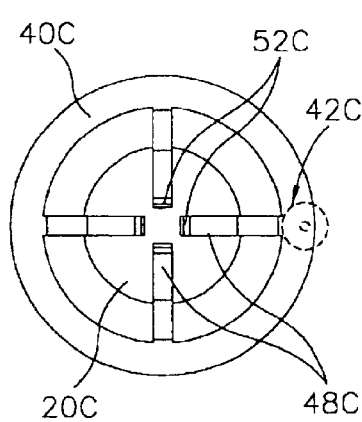
FIG. 8H is an enlarged plan view taken along section line 8H—8H of FIG. 8F.

Next, as shown in FIG. 8C, a third mask 76C is formed within the recess 20C and penetrating projections 52C are anisotropically etched on the surface of the connecting beam 74C. With an anisotropic etch process the projections 52C are generally conically shaped and have a flat top. A representative height of the projections 52C can be from 10 $\mu$m to 100 $\mu$m. Following etching of the projections 52C all of the masks 68C, 70C and 76C can be stripped.

Figure 8D:
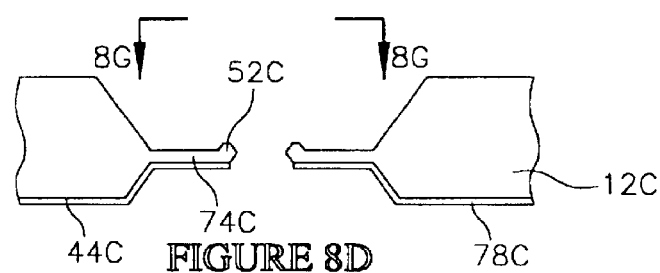

Next, as shown in FIG. 8D, a fourth mask 78C is formed on the backside surface 44C of the substrate 12C. The fourth mask 78C is then used to anisotropically etch four beams 74C from the connecting beam 74C. A peripheral outline of the beams 74C is shown in FIG. 8G. In general the beams 74C are equally spaced and oriented at right angles to one another. In addition, the projections 52C are located proximate to terminal portions of the beams 74C. A spring constant C of the beams 74C can be controlled by selection of the cantilever length (L), the thickness (T), the width (W) and the modulus of elasticity (E) where $C=(EWT^3)/4L^3$, as previously described.

Figure 8E:
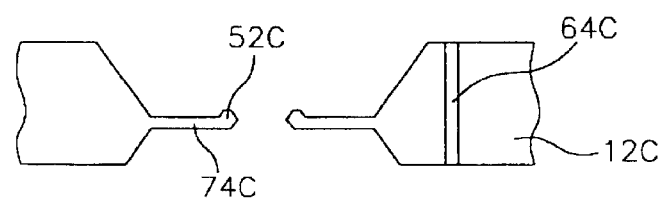

Next, as shown in FIG. 8E, the fourth mask 78C is stripped and an opening 64C is laser machined in the substrate substantially as previously described.

Figure 8F:
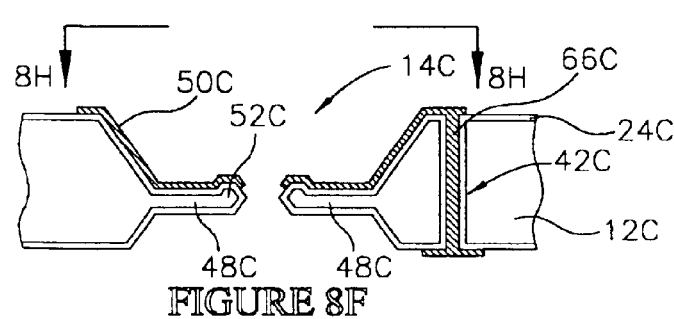

Next, as shown in FIG. 8F, insulating layer 24C are formed within the opening 64C and on exposed surfaces of the substrate 12C. The insulating layer 24C can comprise grown or deposited $SiO_2$ or a polymer as previously described. In addition, a conductive material 66C is deposited in the opening 64C as previously described to form conductive via 42C.

Also as shown in FIGS. 8F and 8G, the metal layers 50C are formed on the beams 74C to complete the conductive beams 48C. A suitable metallization process such as CVD or electrodeposition can be used to form the metal layers 50C. At the same time the metal layers 50C are formed the connecting segment 40C that electrically connects the metal layers 50C can also be formed. The metal layers 50C and connecting segment 40C can comprise a highly conductive metal such as aluminum, titanium, nickel, iridium, copper, gold, tungsten, silver, platinum, palladium, tantalum, molybdenum or alloys of these metals. Rather than being a single layer of metal, the metal layers 50C and connecting segment 40C can be formed as multi-layered stacks of metals (e.g., conducting layer/non-bonding layer).

The metal layers 50C and connecting segment 40C can be formed using a metallization process (e.g., deposition, photopatterning, etching). An exemplary metallization process is disclosed in U.S. Pat. No. 5,607,818, incorporated herein by reference. The metal layers 50C and connecting segment 40C can also be formed using a plating process, such as electrolytic deposition, or electroless deposition. A representative thickness of the metal layers 50C and connecting segment 40C can be from 600 Å to 20,000 Å.

In each of the fabrication methods illustrated in FIGS. 5A–5H, FIGS. 7A–7I and FIGS. 8A–8F, the substrate comprises silicon. However, the same fabrication processes can be employed with substrates formed of ceramic. In the case of ceramic, a suitable wet etchant for performing the etching processes comprises an acid such as HF.

Die Level Test System

Referring to FIGS. 9A–9C. a test carrier 80 constructed using an interconnect 10A constructed in accordance with the invention is illustrated. The test carrier 80 is adapted to temporarily package semiconductor components 18A for test and burn-in. The semiconductor components 18A can comprise either bare dice, or chip scale packages. The semiconductor components 18A include bumped contacts 16A, such as solder balls, in electrical communication with the integrated circuits contained on the components 18A.

The test carrier 80 includes the interconnect 10A, and a force applying mechanism 82. The interconnect 10A includes contacts 14D adapted to make temporary electrical connections with the bumped contacts 16A on the components 18A. The contacts 14D can be formed as previously described for contacts 14A (FIGS. 5A–5H), or contacts 14A' (FIGS. 6A-6F), or contacts 14B (FIGS. 7A–7I), or contacts 14C (FIGS. 8A-8H). In addition, the interconnect 10A includes conductive vias 42D in electrical communication with the contacts 14A and with contact pads 38D. The conductive vias 42D can be formed as previously described for conductive vias 42B (FIG. 3C). The contact pads 38D can be formed as previously described for contact pads 38B (FIG. 3C).

The interconnect 10A also include terminal contacts 84 attached to the contact pads 38D. The terminal contacts 84 comprise metal balls soldered, or otherwise bonded, to the contact pads 38D. Alternately other types of terminal contacts such as pins, flat pads, or shaped wires can be employed. The terminal contacts 84 are adapted to electrically engage mating electrical connectors (not shown) on a test apparatus 96 (FIG. 9A), such as a burn-in board. The test apparatus 96 includes, or is in electrical communication with test circuitry 98, adapted to apply test signals to the integrated circuits contained on the components 18A, and to analyze the resultant signals. The test carrier 80, test apparatus 96, and test circuitry 98 form a test system 100 (FIG. 9A).

The test carrier 80 also includes an alignment member 86 adapted to align the bumped contacts 16A on the components 18A, to the contacts 14D on the interconnect 10A. The alignment member 86 includes openings 88 configured to contact the peripheral edges of the components 18A to guide the components 18A onto the contacts 14D. The alignment member 86 can be constructed, as described in U.S. Pat. No. 5,559,444, entitled "METHOD AND APPARATUS FOR TESTING UNPACKAGED SEMICONDUCTOR DICE", incorporated herein by reference. As another alternative, the alignment member 86 can be eliminated and the components 18A can be aligned with the contacts 14D using an optical alignment technique. Such an optical alignment technique is described in U.S. Pat. No. 5,796,264, entitled "APPARA- TUS FOR MANUFACTURING KNOWN GOOD SEMICONDUCTOR DICE", which is incorporated herein by reference.

As shown in FIGS. 9A and 9B, the force applying mechanism 82 includes a clamp member 90 which attaches to the interconnect 10A, and a plurality of biasing members 92 for pressing the components 18A against the contacts 14D. In the illustrative embodiment, the biasing members 92 comprise elastomeric blocks formed of a polymer material such as silicone, butyl rubber, flourosilicone, or polyimide. Alternately the biasing members 92 can comprise steel leaf springs. The clamp member 90 includes tabs 94 for engaging the interconnect 10A to secure the clamp member 90 to the interconnect 10A.

In the illustrative embodiment, the clamp member 90 attaches directly to the interconnect 10A which is configured to form a base for the test carrier 80. However, the test carrier 80 can include a separate base, and the interconnect 10A can be mounted to the base as is described in U.S. Pat. No. 5,519,332 to Wood et al.; U.S. Pat. No. 5,541,525 to Wood et al.; U.S. Pat. No. 5,815,000 to Farnworth et al.; and U.S. Pat. No. 5,783,461 to Hembree, all of which are incorporated herein by reference.

Wafer Level Test System

Figure 10:
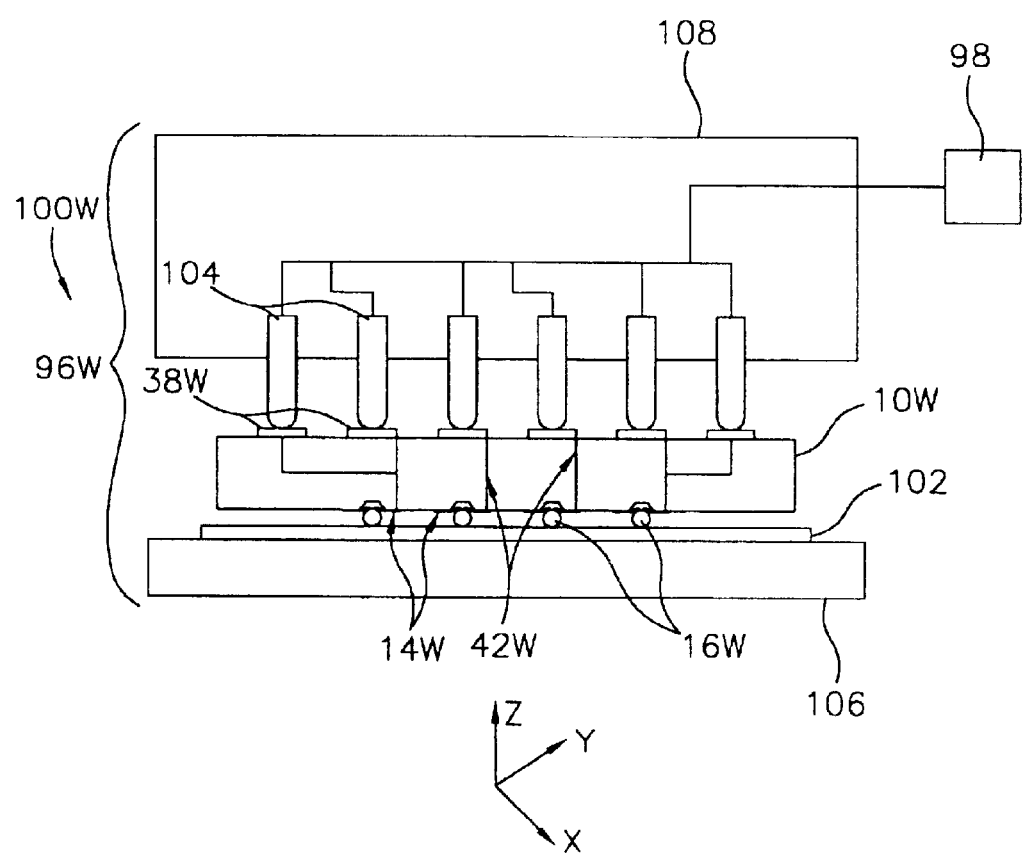
FIG. 10 is a schematic cross sectional view of a wafer level test system incorporating an interconnect constructed in accordance with the invention.

Referring to FIG. 10, a wafer level system 100W suitable for testing a semiconductor wafer 102 having bumped contacts 16W is illustrated. The wafer level test system 100W includes an interconnect 10W constructed in accordance with the invention as previously described, and mounted to a testing apparatus 96W.

The testing apparatus 96W includes, or is in electrical communication with test circuitry 98. The testing apparatus 96W can be a conventional wafer probe handler, or probe tester, modified for use with the interconnect 10W. Wafer probe handlers and associated test equipment are commercially available from Electroglass, Advantest, Teradyne, Megatest, Hewlett-Packard and others. In this system 100W, the interconnect 10W takes the place of a conventional probe card.

The interconnect 10W includes contacts 14W configured to establish electrical communication with the bumped contacts 16W on the wafer 102. The contacts 14W can be formed as previously described for contacts 14A (FIGS. 5A–5H), or contacts 14A' (FIGS. 6A–6F), or contacts 14B (FIGS. 7A–7I), or contacts 14C (FIGS. 8A-8H). In addition, the interconnect 10W includes conductive vias 42W in electrical communication with the contacts 14W and with contact pads 38W. The conductive vias 42W can be formed as previously described for conductive vias 42B (FIG. 3C). The contact pads 38W can be formed as previously described for contact pads 38B (FIG. 3C).

The testing apparatus 96W also includes a wafer chuck 106 configured to support and move the wafer 102 in x, y and z directions as required. In particular, the wafer chuck 106 can be used to step the wafer 102 so that the dice on the wafer 102 can be tested in groups until all of the dice have been tested. Alternately, the interconnect 10W can be configured to contact all of the bumped contacts 16W for all of the dice on the wafer 102 at the same time. Test signals can then be selectively applied and electronically switched as required, to selected dice on the wafer 102.

As also shown in FIG. 10, the interconnect 10W can mount to a probe card fixture 108 of the testing apparatus 96W. The probe card fixture 108 can be similar in construction to a conventional probe card fixture commercially available from manufacturers such as Packard Hughes Interconnect and Wentworth Laboratories. The probe card fixture 108 can be formed of an electrically insulating material such as FR-4 or ceramic. In addition, the testing apparatus 96W can include a force applying mechanism in the form of multiple spring loaded electrical connectors 104 associated with the probe card fixture 108. The spring loaded electrical connectors 104 are in electrical communication with the testing circuitry 98.

The spring loaded electrical connectors 104 can be formed in a variety of configurations. One suitable configuration is known as a "POGO PIN" connector. This type of electrical connector includes a spring loaded pin adapted to contact and press against a flat surface to form an electrical connection. Pogo pin connectors are manufactured by Pogo Instruments, Inc., Kansas City, Kans. The spring loaded electrical connectors 104 can also comprise wires, pins or cables formed as spring segments or other resilient members.

In this embodiment the spring loaded electrical connectors 104 electrically contact the contact pads 38W formed on the interconnect 10W. This arrangement provides separate electrical paths from the testing circuitry 98, through the spring loaded electrical connectors 104, through the contact pads 38W, through the conductive vias 42W and through the contacts 14W to the bumped contacts 16W. During a test procedure, test signals can be applied to the integrated circuits on the wafer 102 using these separate electrical paths.

In addition to establishing electrical communication with the interconnect 10W, the spring loaded electrical connectors 104 also provide a mechanical force necessary for biasing the interconnect 10W against the wafer 102. Further details of a wafer level system similar to the system 100W are contained in U.S. patent application Ser. No. 08/797,719, filed Feb. 10, 1997, entitled "PROBE CARD FOR SEMICONDUCTOR WAFERS AND METHOD AND SYSTEM FOR TESTING WAFERS" which is incorporated herein by reference.

Thus the invention provides an improved test interconnect for testing semiconductor components having bumped contacts. The interconnect include contacts designed to provide a reliable electrical connection to the bumped contacts with a minimal application of contact force. In addition, the contacts are constructed to center the bumped contacts and to move in the z-direction to accommodate variations in the size or planarity of the bumped contacts.

While the invention has been described with reference to certain preferred embodiments, as will be apparent to those skilled in the art, certain changes and modifications can be made without departing from the scope of the invention as defined by the following claims.

What is claimed is:

1. An interconnect for testing a semiconductor component having a bumped contact comprising:
    a substrate; and
    a contact on the substrate configured for electrical engagement with the bumped contact, the contact comprising a recess in the substrate, a plurality of flexible leads cantilevered over the recess configured to support the bumped contact within the recess and to move within the recess, each lead comprising at least one projection and a conductive polymer outer layer on the at least one projection.

2. The interconnect of claim 1 wherein the leads comprise a polymer tape attached to the substrate.

3. The interconnect of claim 1 wherein the leads comprise etched beams on the substrate.

4. The interconnect of claim 1 wherein the bumped contact comprises solder and the conductive polymer outer layer comprises silicone or carbon.

5. An interconnect for testing a semiconductor component having a bumped contact comprising:

a substrate having a recess;

a plurality of flexible leads on the substrate cantilevered over the recess configured to electrically engage the bumped contact and to move within the recess by a distance sufficient to accommodate variations in a size, a shape or a planarity of the bumped contact, each lead comprising a projection configured to penetrate the bumped contact, and a conductive polymer outer layer on the projection configured to provide a non-bonding surface for contacting the bumped contact.

6. The interconnect of claim 5 wherein the conductive polymer outer layer comprises a material selected from the group consisting of a carbon film and a metal filled silicone.

7. The interconnect of claim 6 wherein the projection comprises a blade.

8. The interconnect of claim 5 wherein each lead comprises a metal at least partially covered by the conductive polymer outer layer.

9. An interconnect for testing a semiconductor component having a bumped contact comprising:

a substrate having a recess;

a plurality of leads on the substrate cantilevered over the recess and configured to move and to electrically engage the bumped contact within the recess, each lead comprising a plurality of projections and a conductive polymer outer layer on the projections.

10. The interconnect of claim 9 wherein the leads include a conductive connecting portion proximate to the recess for electrically connecting the leads to one another.

11. The interconnect of claim 9 wherein the bumped contact comprises solder and the leads comprise a non-solder wettable metal.

12. The interconnect of claim 9 wherein the conductive polymer outer layer comprises a material selected from the group consisting of carbon and silicone.

13. The interconnect of claim 9 wherein the leads and the projections comprise a metal.

14. A system for testing a semiconductor component having a bumped contact comprising:

a testing apparatus;

an interconnect on the testing apparatus comprising:

a substrate having a recess;

a plurality of leads on the substrate configured for electrical engagement with the bumped contact, each lead cantilevered over the recess and configured to move within the recess during the electrical engagement, each lead comprising a projection and a conductive polymer outer layer on the projection.

15. The system of claim 14 wherein the conductive polymer outer layer comprises a material selected from the group consisting of carbon and silicone.

16. The system of claim 14 wherein the leads comprise a polymer tape attached to the substrate and comprising an electrical connector configured in electrical communication with the connecting segment and the test circuitry.

* * * * *